United States Patent [19]
Fujiwara et al.

[11] Patent Number: 6,081,919
[45] Date of Patent: Jun. 27, 2000

[54] CODING AND DECODING SYSTEM USING CRC CHECK BIT

[75] Inventors: Atsushi Fujiwara; Tomohiro Dohi, both of Kanagawa; Toshifumi Sato, Tokyo, all of Japan

[73] Assignee: NEC Corporation, Japan

[21] Appl. No.: 08/997,121

[22] Filed: Dec. 23, 1997

[30] Foreign Application Priority Data

Dec. 27, 1996 [JP] Japan ................................. 8-350678

[51] Int. Cl.⁷ ................ H03M 13/00; H03M 13/12; H03M 13/22
[52] U.S. Cl. ................ 714/755; 714/758; 714/761; 714/765
[58] Field of Search ................ 714/755, 756, 714/758, 761, 762, 765, 780, 784

[56] References Cited

U.S. PATENT DOCUMENTS

| | | | |
|---|---|---|---|
| 4,718,066 | 1/1988 | Rogard | 371/35 |
| 4,785,451 | 11/1988 | Sako et al. | 371/37 |
| 5,608,740 | 3/1997 | Watanabe | 371/37.4 |

*Primary Examiner*—Stephen M. Baker
*Attorney, Agent, or Firm*—Ostrolenk, Faber, Gerb & Soffen, LLP

[57] ABSTRACT

A coding and decoding system which uses CRC check bits is disclosed. When a coding apparatus performs coding, symbol interleaving is performed after coding by an outer code of a concatenated code, and coding by an inner code is performed after CRC check bits are added. Then, upon decoding by a decoding apparatus, error detection using the CRC check bits is performed after decoding of the inner code. After symbol deinterleaving is performed, decoding of the outer code by erasure decoding or error correction is performed depending upon the number of symbols included in a frame in which an error has been detected.

20 Claims, 9 Drawing Sheets

TO TRANSMITTER

···○··· ONLY INNER CODE

—△— INNER CODE + OUTER CODE (ERASURE DECODING)

—▲— INNER CODE + OUTER CODE (SOVA)

—■— INNER CODE + OUTER CODE (CRC CHECK BITS)

CODING AND DECODING SYSTEM USING CRC CHECK BIT

BACKGROUND OF THE INVENTION

1. Field of the Invention

This invention relates to a coding and decoding system, and more particularly to a channel coding and decoding system for digital mobile communication.

2. Description of the Related Art

Conventionally, when using a coding and decoding system which includes a coding apparatus and a decoding apparatus, particularly a channel coding and decoding system which is used for digital mobile communication, channel coding is used in order to prevent a variation of the received power (i.e., fading) or to prevent deterioration of the communication quality caused by interference from a user who uses the same frequency channel. Among various coding systems, a coding system which uses a convolutional code is frequently used. This is because a high error correction effect can be obtained even with a channel which exhibits a comparatively high bit error ratio (BER).

However, by using a convolutional code in the coding system sometimes gives rise to error in propagation due to the characteristics of the coding system. When only the coding system by a convolutional code is employed, occurrence of burst errors cannot be avoided when the received power is lowered significantly by fading or in other similar circumstances.

One method for preventing burst errors which is frequently used by interleaving which rearranges an information sequence with respect to its order. The method by interleaving signifies a method wherein, on the transmission side, an information sequence of a fixed amount is stored into a buffer and then re-arranged in order, and on the reception side, the information sequence is re-arranged to restore the original order thereof. Generally, as the interleave size, which is the size of the buffer, increases, the correction capacity of burst errors increases. However, there is a problem that, as the interleave size increases, a delay which arises upon decoding, increases.

Another method for reducing burst errors employs a concatenated code. The coding method using a concatenated code first performs error correction coding for an information sequence and then performs further coding for the error correction coded information sequence thereby to permit correction of burst errors efficiently. The coding performed first is called outer coding, and the coding performed second is called inner coding. In a concatenated code which is employed in order to reduce burst errors, a convolutional code is used for the inner code while a nonbinary block code where a block is partitioned into certain symbol units is used for the outer code. Here, one symbol is a unit of a fixed number of bits, and 8 bits are frequently used. However, one symbol is not necessarily limited to 8 bits.

FIGS. 1a and 1b are flow charts illustrating a conventional basic coding method using a concatenated code.

FIG. 1a is a flow chart illustrating processing on the transmission side. Nonbinary block coding is performed for an information sequence (step 110) and then convolutional coding is performed for a frame which is an information sequence thus produced (step 120). Conventionally, interleaving is sometimes performed after each coding in order to raise the error correction capacity, but this has not necessarily been essential.

FIG. 1b is a flow chart illustrating processing on the reception side. Decoding of convolutional codes is performed for a demodulated information sequence (step 130) and decoding of nonbinary block codes is performed for the decoded information sequence (step 140). In the nonbinary block codes, the number of error symbols which can be corrected in one frame is called error correction capability. Meanwhile, when the positions of error symbols are specified in one frame, the number of symbols whose errors can be corrected is called erasure decoding capability. The erasure decoding capability when decoding is performed using nonbinary block codes is equal to or higher than the error correction capability. Particularly when a code having a erasure decoding capability higher than the error correction capability is used as the outer code, decoding of a higher efficiency can be achieved by performing erasure decoding.

However, in order to effect erasure decoding, information for specifying the positions of error symbols is required. The SOVA (Soft Output Viterbi Algorithm) has been proposed which is a decoding system wherein, when convolutional codes are to be decoded using Viterbi decoding in an inner code, the reliability of decoded symbols is calculated, and then in decoding of the outer code, the reliability is utilized (J. Hagenauer and P. Hoeher, "A Viterbi Algorithm with Soft-Decision Outputs and its Applications", IEEE).

FIG. 2 is a flow chart illustrating decoding processing of the SOVA. In this system, in determining a survivor path in decoding of a convolutional code (step 210), reliability information 240 for each bit is calculated based on a metric of the path. Reliability information 240 represents by what degree a path, which has been determined as a survivor path, is reliable. Reliability information 240 is outputted together with decoding result 260. Then, symbol deinterleaving is performed while maintaining reliability information 240 for each bit, and decoding result 270 and deinterleaved reliability information 250 for each bit are outputted (step 220). Finally, when performing decoding of nonbinary block codes which are outer codes, decoding of deinterleaved decoding result 270 is performed using deinterleaved reliability information 250 for each bit (step 230).

In decoding of inner codes, a large amount of calculation is required in order to calculate reliability information for each bit. Meanwhile, in decoding of outer codes, since the reliability information for each bit is utilized, a large storage capacity is required. Further, since the amount of reliability information transmitted from a decoding apparatus for an inner code to a decoding apparatus for an outer code is large, there is a problem that a channel having a large capacity is required between the decoding apparatus for an inner code and the decoding apparatus for an outer code.

SUMMARY OF THE INVENTION

It is an object of the present invention to provide a coding and decoding system which effects erasure decoding effectively by a small amount of calculation and has a high error correction capability.

In order to attain the object described above, according to the present invention, when effecting channel coding using a concatenated code, a coding apparatus on the transmission side first adds CRC check bits after coding by outer codes and then performs coding by inner codes. Then, a decoding apparatus on the reception side performs error detection using the CRC check bits after decoding of the inner codes and performs symbol deinterleaving, and thereafter it determines symbols to be erasure decoded using a result of the error detection and then performs decoding of the outer codes.

By the construction described above, when compared with an alternative case wherein channel coding is performed using a concatenated code by which decoding of outer codes is effected by performing error correction, error correction with a higher degree of accuracy can be achieved.

Further, according to the present invention, since it is required only to perform error detection with the CRC check bits after decoding of the inner codes is completed and to output one bit representing whether or not a frame error has been detected to the decoder for an outer code, implementation of an apparatus is facilitated when compared with that by the SOVA and furthermore a characteristic similar to that of the SOVA can be obtained.

Further, according to the present invention, erasure decoding is performed when the number of symbol erasures in a frame does not exceed the erasure correction capability of the outer code. When the number of symbol erasures exceeds the erasure correction capability of the outer code, decoding is performed by error correction. Accordingly, the present invention can achieve more effective error correction than that of an alternative case wherein erasure decoding is not performed but only error correction is performed.

The above and other objects, features and advantages of the present invention will become apparent from the following description with reference to the accompanying drawings which illustrate examples of the present invention.

DETAILED DESCRIPTION OF THE PREFERRED EMBODIMENTS (First Embodiment)

Figure 1A:
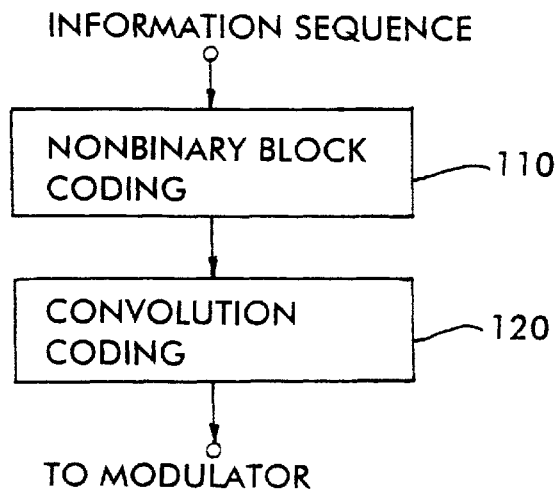
FIGS. 1a and 1b are flow charts illustrating processing of a conventional basic coding method by a concatenated code.
Figure 1B:
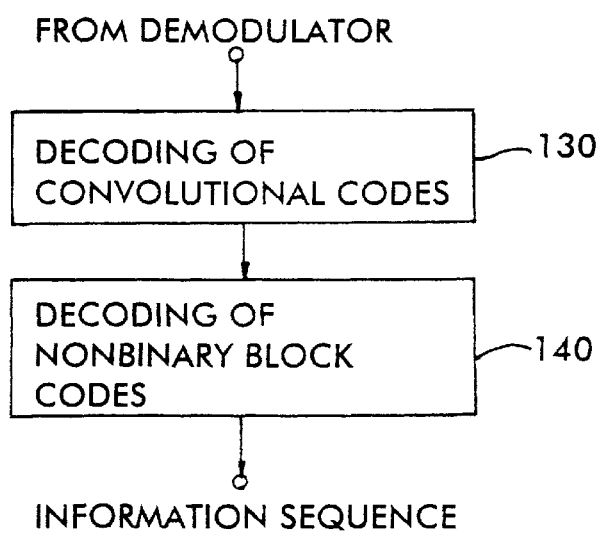
Figure 2:
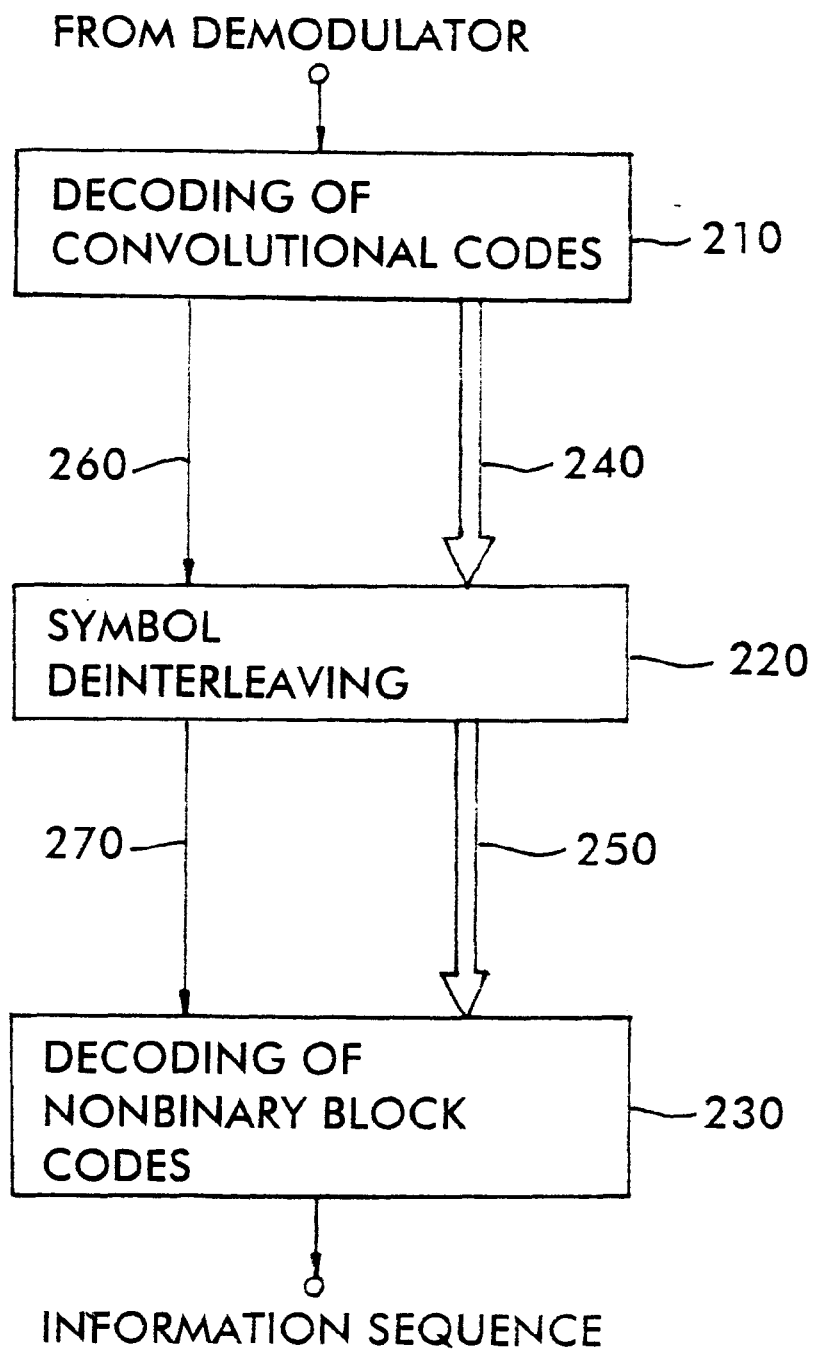
FIG. 2 is a flow chart illustrating processing of the SOVA.
Figure 3A:
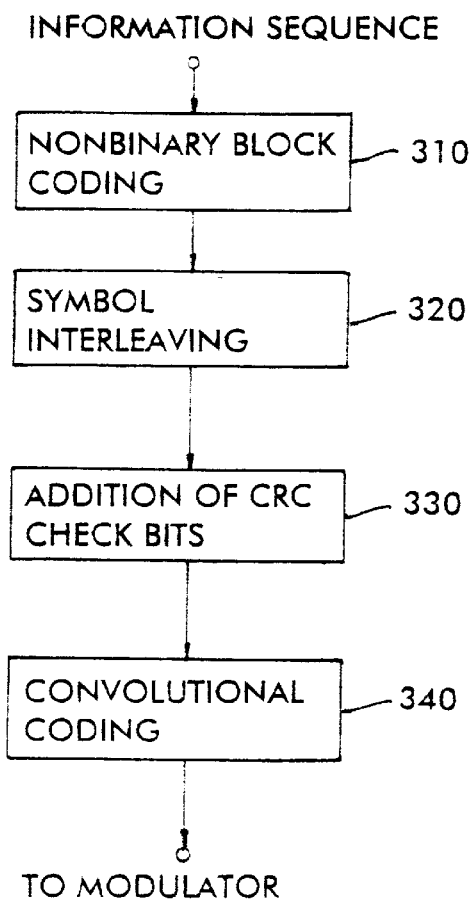
FIG. 3a is a flow chart illustrating coding of a first embodiment of the present invention.

First, coding processing is described with reference to FIG. 3a.

First, an information sequence to be transmitted is converted into a multiple information sequence. Nonbinary block coding, wherein nonbinary block codes are used for the outer code, of a concatenated code is performed for the resulting multiple information sequence (step 310). Then, symbol interleaving is performed for the information sequence to which check symbols are added (step 320). For the check symbols, for example, an RS code (Reed-Solomon Code) can be used. Then, the interleaved information sequence is converted back into a binary information sequence and CRC (Cyclic Redundancy Code) check bits are added to the binary information sequence (step 330). Thereafter, convolutional coding, wherein a convolutional code is used for the inner code of a concatenated code, is performed for the resulting binary information sequence (step 340). Then, a resulting signal sequence is outputted to a modulator.

Now, decoding processing is described with reference to FIG. 3b.

First, decoding of convolutional codes, which are inner codes of a concatenated code, is performed for an information sequence produced by decoding of a received signal sequence (step 350). Error detection by CRC check bits is performed for the decoded information sequence (step 360), and symbol deinterleaving is performed for a result of the decoding and a result of the error detection (step 370) to produce frames of nonbinary block codes which are outer codes of the concatenated code. Then, symbols which have been included in those frames from which errors have been detected based on the interleaved decoding result and error detection result are regarded and determined as lost symbols (step 380). When an RS code is used for the check symbols, erasure correction is performed with the assumption that symbols not marked as lost are error-free (step 390). Finally, the information is converted into binary information and outputted as an information sequence of a decoding result.

Figure 4:
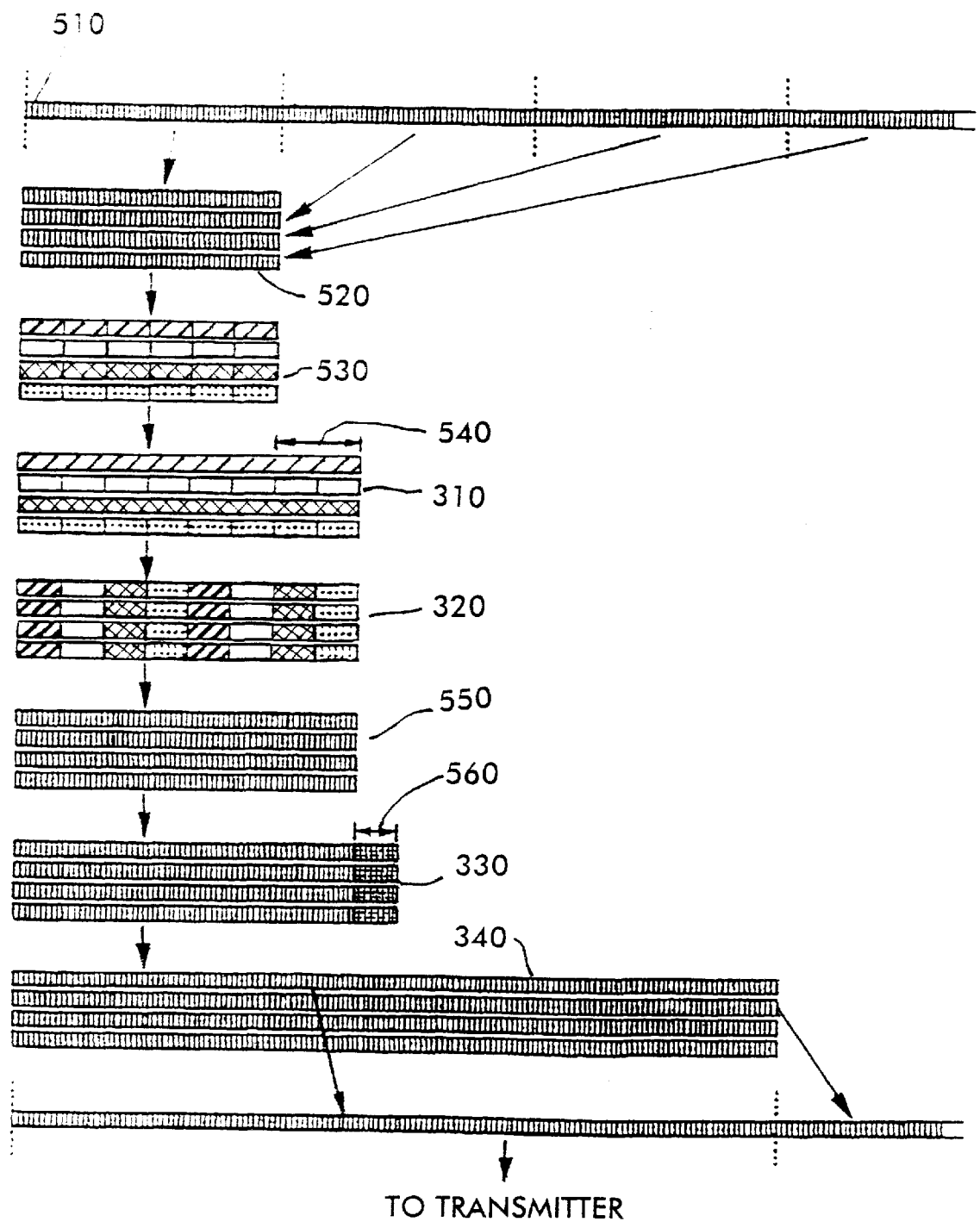
FIG. 4 is a bit diagram in coding of the first embodiment of the present invention.

FIG. 4 is a view showing a bit diagram of the coding apparatus of the first embodiment of the present invention. In FIG. 4, corresponding elements to those of FIG. 3a are denoted by same reference symbols.

First, an information sequence 510 to be transmitted is partitioned into block units and stored into a buffer (step 520). Here, the buffer size, that is, the interleave size, is a product of one block length of nonbinary block codes and the depth of the interleave. While it is illustratively shown in FIG. 4 that the depth of the interleave is 4, this number is a mere value for convenience of explanation.

Then, each block is partitioned into symbol units and conversion of the information sequence into a multiple information sequence is performed (step 530). As described above, one symbol signifies a unit of a fixed number of bits, and while 8 bits are frequently used, one symbol is not necessarily limited to 8 bits. One block partitioned in symbol units is called one frame. While, in the figure (step 530) of the conversion of the information sequence into a multiple information sequence, four frames are illustratively shown in four different patterns, this illustration is intended to make description of the symbol interleaving (step 320) clear. In contrast, the pattern of information sequence 510 indicates that the information sequence is binary information.

After the multiple conversion, the information sequence is converted into multiple blocks check symbols 540 are added to the multiple blocks (step 310). Thereafter, symbol interleaving is performed (step 320), and then the information sequence is converted back into a binary information sequence (step 550). Then, CRC check bits 560 are added (step 330). Finally, convolutional coding is performed as inner codes of a concatenated code (step 340), and resulting convolutional codes are outputted to the transmitter.

Figure 5:
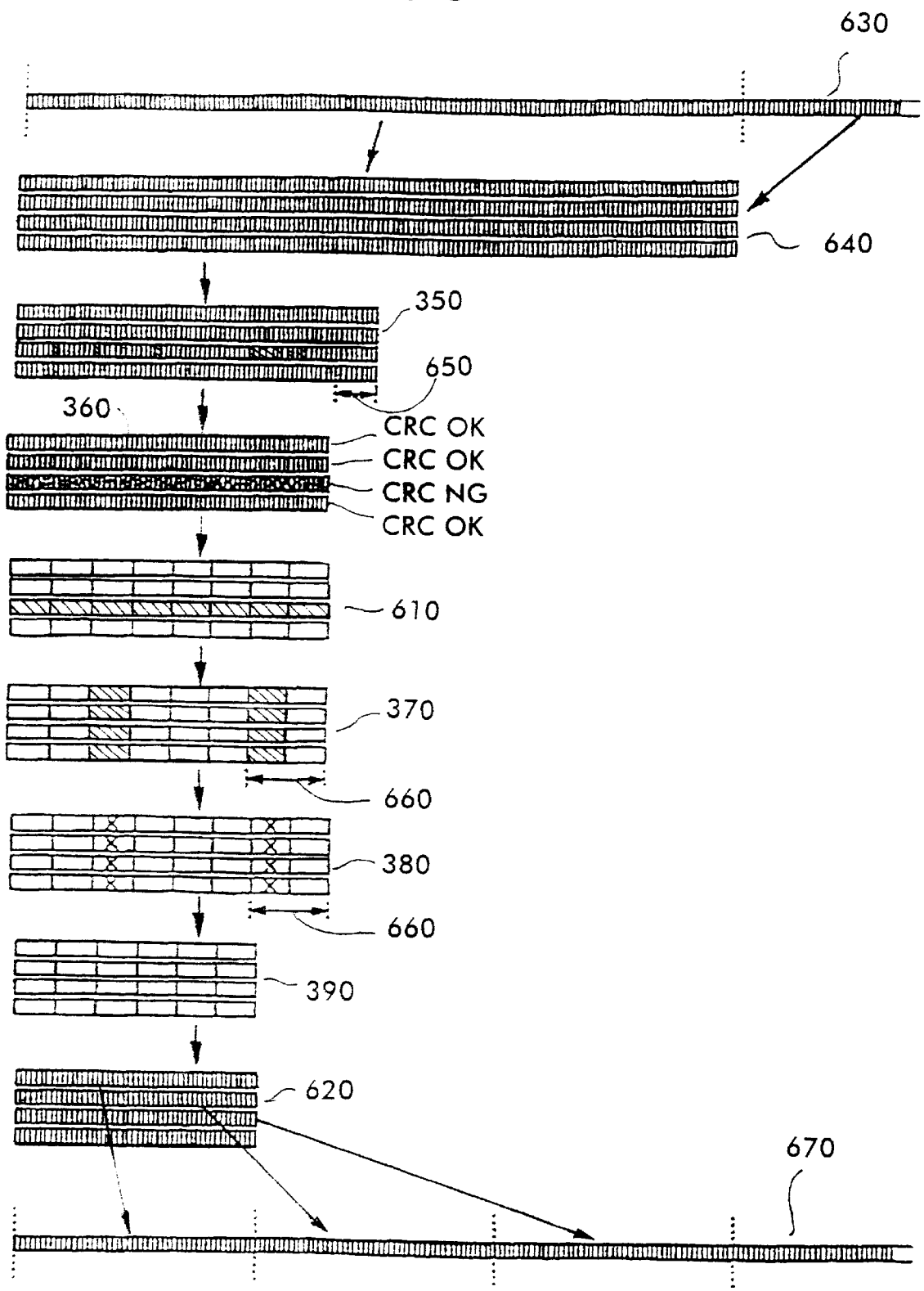
FIG. 5 is a bit diagram in decoding of the first embodiment of the present invention.

FIG. 5 is a view showing a bit diagram of a decoding apparatus of the first embodiment of the present invention. In FIG. 5, corresponding elements to those of FIG. 3b are denoted by same reference symbols.

First, signal 630, obtained by decoding a received signal, is partitioned into block units and stored into a buffer (step 640). Then, decoding of convolutional codes is performed (step 350). Here, each location shown in black indicates a position of a bit with which an error in decoding has occurred. CRC check bits 650 are present in a result of decoding obtained by decoding of the convolutional codes.

Thereafter, error detection by CRC check bits 650 is performed (step 360). Each block in which a decoding error has been detected by the error detection is indicated as CRC NG, but each block in which no decoding error has been detected is indicated as CRC OK. Then, multiple conversion of the information sequence is performed (step 610), and each symbol included in frames in which errors have been detected is indicated by a pattern with slanting lines added thereto. Furthermore, even after symbol deinterleaving is performed, the symbol is indicated by the same pattern (step 370). Here, check symbols 660 are present in the symbol deinterleaved decoding result.

Then, the symbols having the patterns added thereto are regarded as symbols which have been lost, in the determination of lost symbols. Each of the symbols regarded as lost is indicated by mark X (step 380). Then, decoding of the nonbinary block codes by erasure decoding (step 390) is performed. Finally, the information is converted into binary information (step 620) and outputted as information sequence 670 of the decoding result.

(Second Embodiment)

Figure 6:
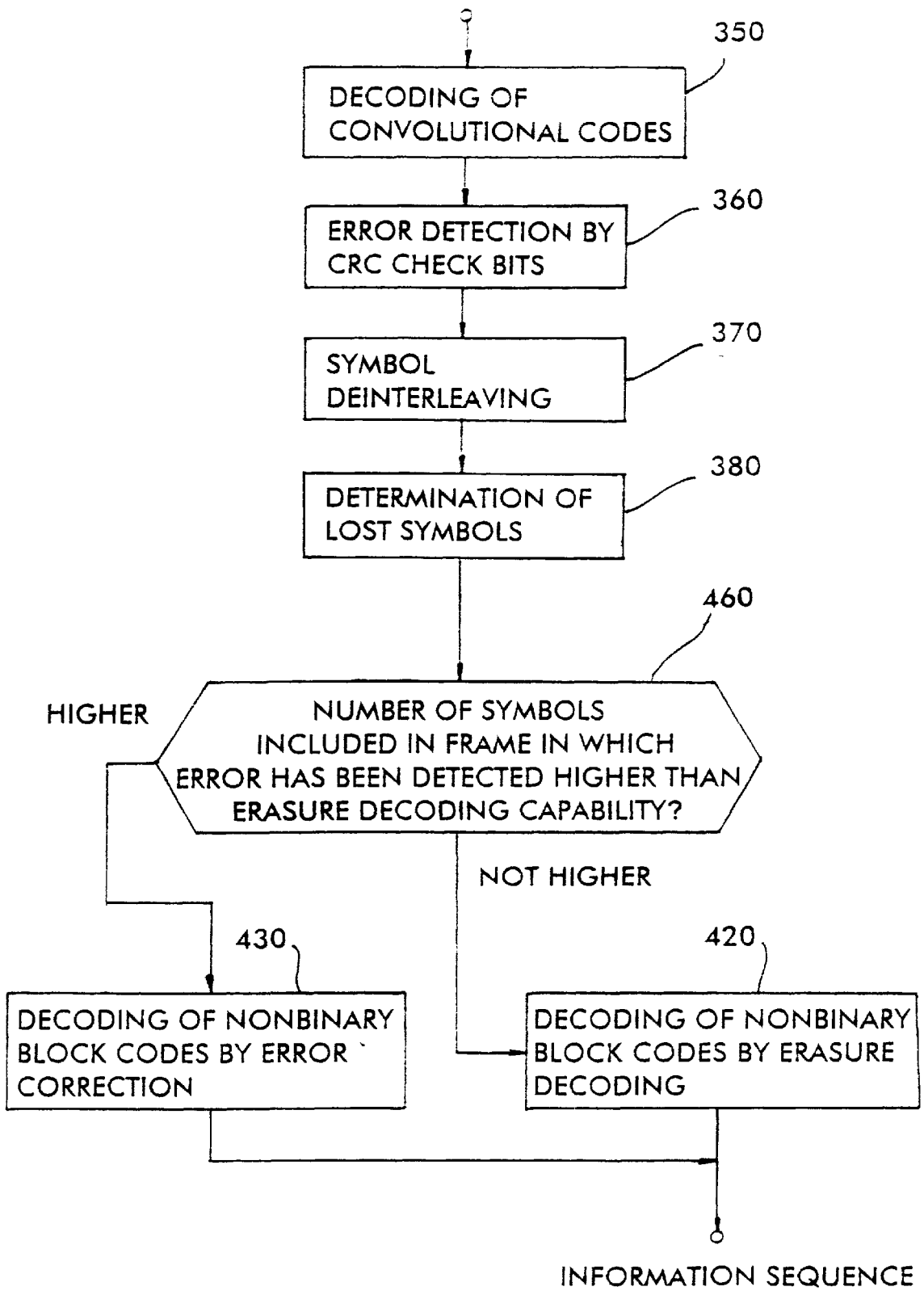
FIG. 6 is a flow chart illustrating decoding in a second embodiment of the present invention.

FIG. 6 is a flow chart illustrating a second embodiment of the present invention.

Figure 3B:
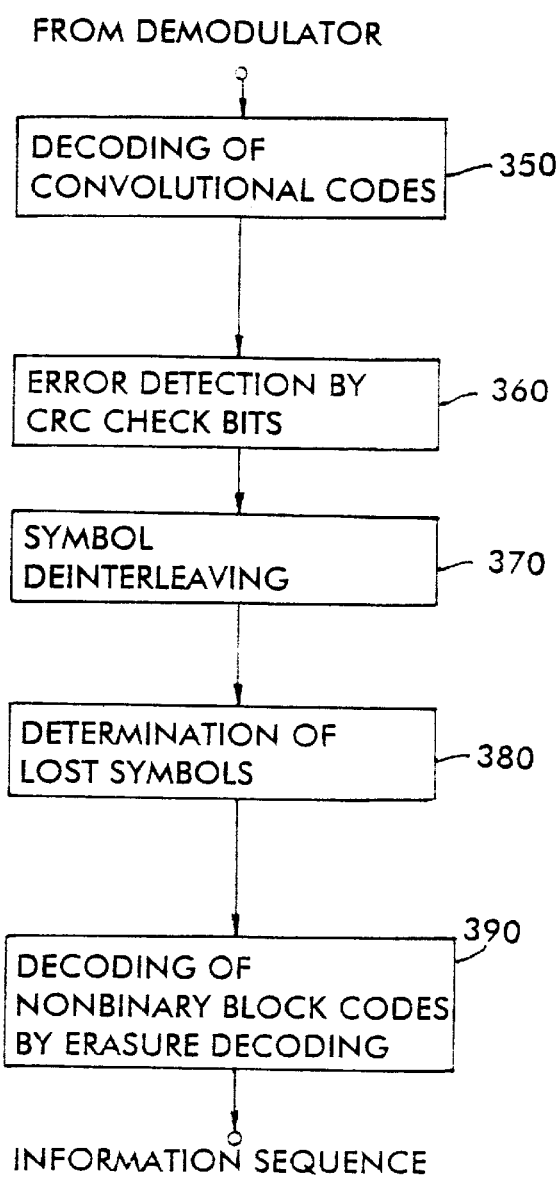
FIG. 3b is a flow chart illustrating decoding of the first embodiment of the present invention.

Referring to FIG. 6, decoding of convolutional codes (step 350), error detection by CRC check bits (step 360), symbol deinterleaving (step 370) and determination of lost symbols (step 380) are similar to those of FIG. 3b.

Then, after the determination of lost symbols (step 380), it is determined whether or not the number of symbols included in each of the frames in which errors have been detected is higher than the erasure decoding capability of the outer code (step 460), and if the number of symbols is not higher, then decoding of multiple blocks by erasure decoding (step 420) is performed. Erasure decoding is performed on the symbols which have been included in each of those frames in which errors have been detected as lost symbols, by using, for example, an RS code as in the case of the first embodiment described above. If the number of symbols included in a frame in which an error has been detected is higher than the erasure decoding capability of the outer code, it is impossible to correct all of the errors by erasure decoding.

However, where the number of error detected symbols in a frame is higher than the erasure correction capability, all erroneous symbols may still be correctable by error correction decoding instead of erasure correction decoding (step 430).

Since the sensitivity of error detection by CRC bits is very high, a frame with a CRC error detected may be mostly correct. Therefore, in the present embodiment, erasure decoding is performed only when all symbols marked as lost can be corrected by erasure decoding, but when not all of the symbols marked as lost can be corrected by erasure decoding, decoding is performed by error correction.

Figure 7:
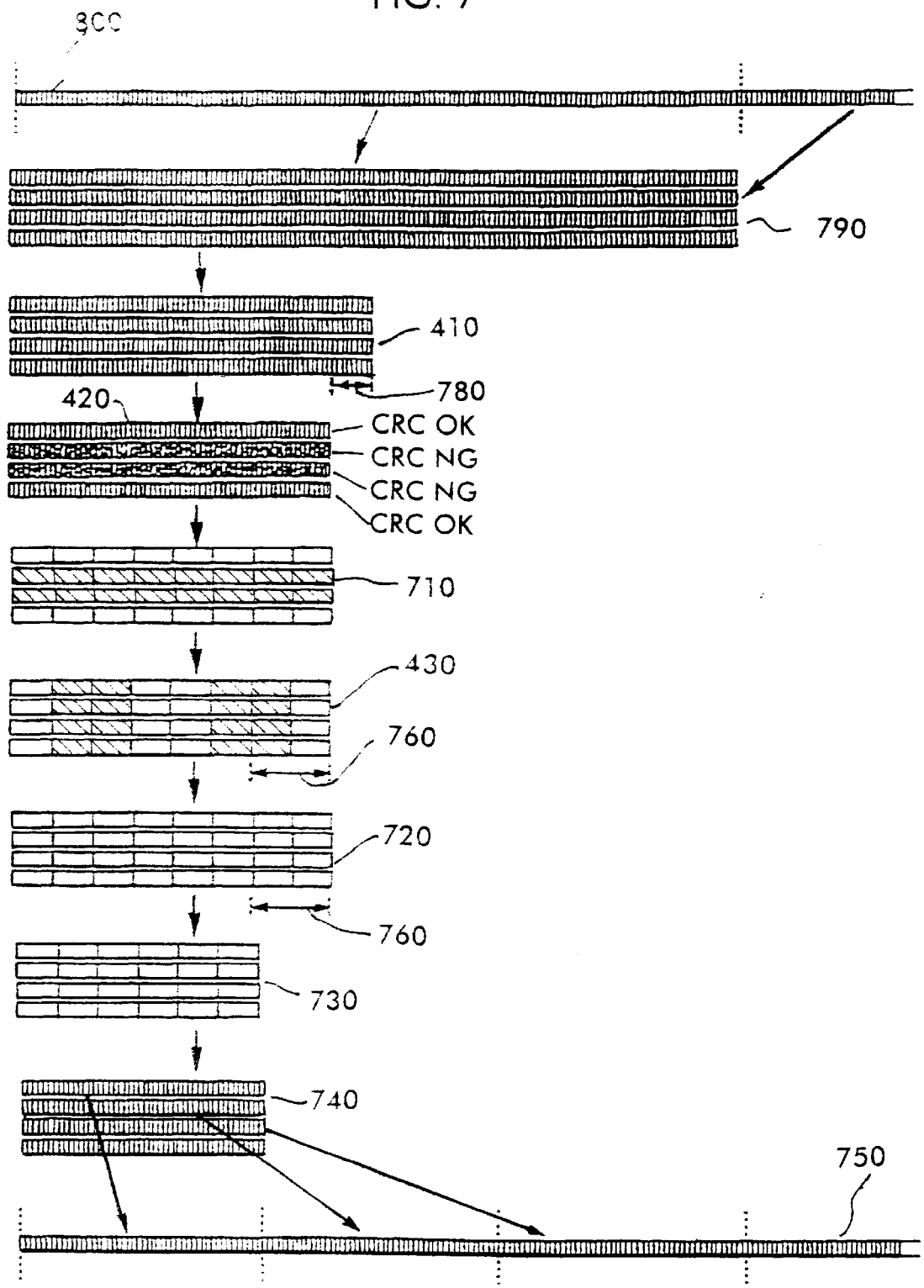
FIG. 7 is a bit diagram in decoding of the second embodiment of present invention.

FIG. 7 is a view showing a bit diagram of the present embodiment. In FIG. 7, corresponding elements to those of FIG. 6 are denoted by same reference symbols.

First, signal 800 obtained by decoding a received signal is partitioned into block units and stored into the buffer (step 790). Thereafter, decoding of convolutional codes is performed (step 410). In the decoding of convolutional codes, the position of each bit with which a decoding error has occurred is indicated by two blocks shown in black. Then, in error detection (step 420) by CRC check bits, two blocks with which decoding errors have occurred are indicated as CRC NG. In multiple conversion of the information sequence (step 710), symbols in the two frames in which errors have been detected are indicated by a pattern with slanting lines, and also in a symbol deinterleaved decoding result (step 430), such symbols are indicated by a similar pattern. In the symbol deinterleaved decoding result, check symbols 760 are present as seen in FIG. 7.

In FIG. 7, it is illustratively shown that the number of symbols included in two frames in which errors have been detected is higher than the erasure decoding capability. Accordingly, no erasure decoding is performed (step 720), but only decoding of nonbinary block codes by error correction is performed (step 730). Finally, the information is converted into binary information (step 740) and outputted as information sequence 750 of the decoding result.

(Third Embodiment)

Figure 8A:
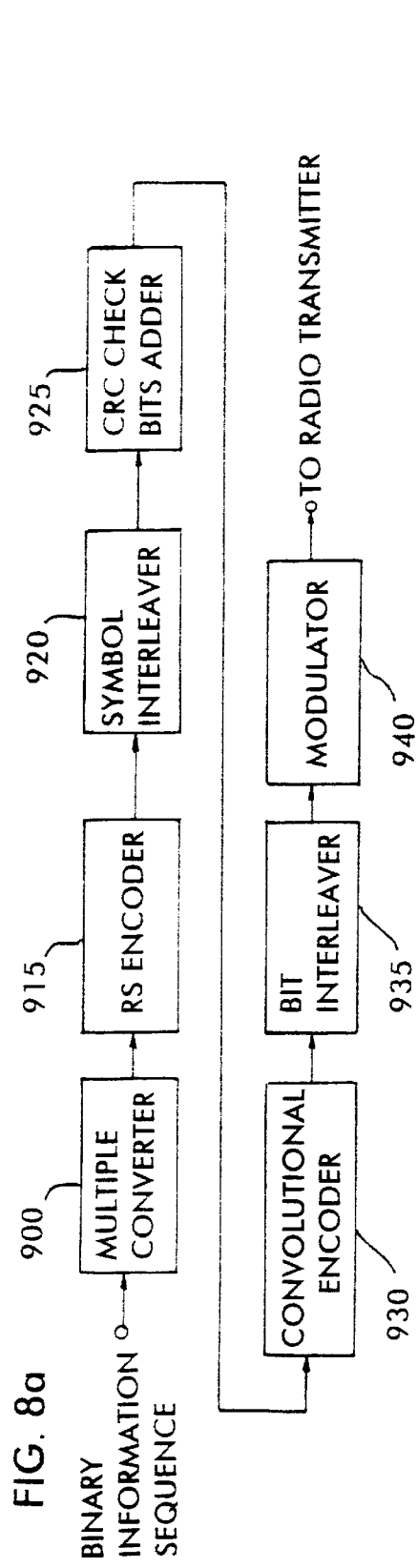
FIG. 8a is a block diagram showing a construction of a coding apparatus in a third embodiment of the present invention.
Figure 8B:
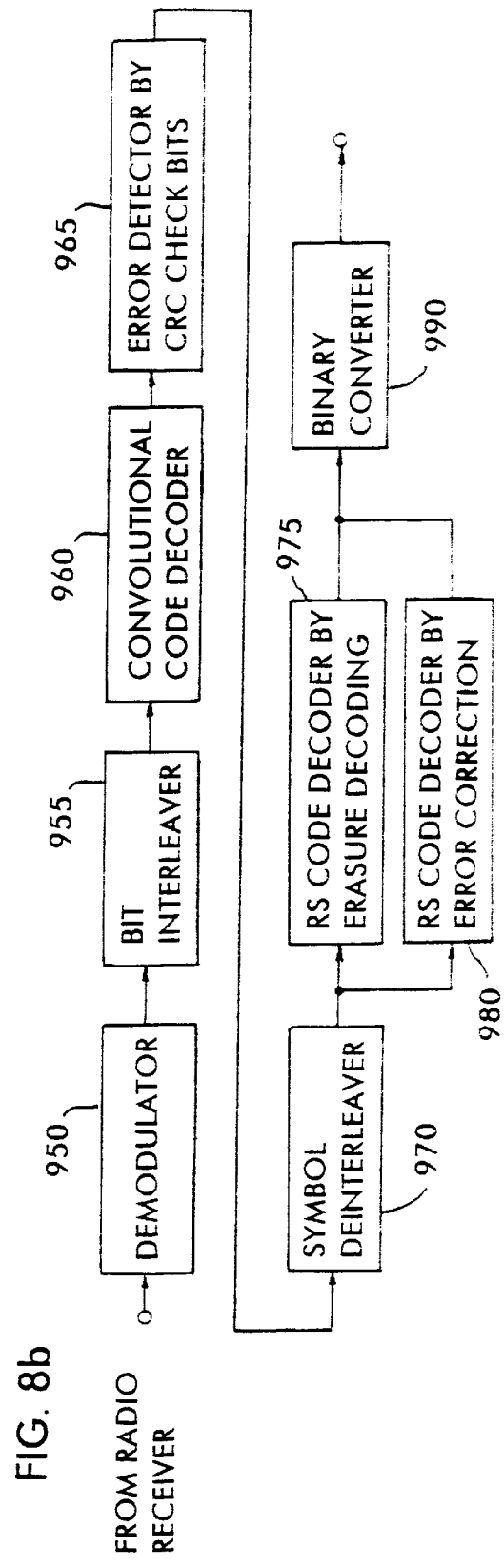
FIG. 8b is a block diagram showing a construction of a decoding apparatus in the third embodiment of the present invention.

FIG. 8a is a block diagram showing a construction of a coding apparatus of a channel coding and decoding system of a third embodiment of the present invention, and FIG. 8b is a block diagram showing a construction of a decoding apparatus.

Also in the present embodiment, the coding apparatus employs an RS code for the outer code of a concatenated code for an information sequence. In the decoding apparatus, erasure symbols are determined by error detection by CRC check bits, and symbol deinterleaving is performed and decoding is performed by error correction by an RS code. Accordingly, the present embodiment can achieve more effective error correction than an alternative case wherein erasure decoding is not performed but only error correction by an RS code is performed.

The coding apparatus of the present embodiment includes multiple converter 900 for multiple converting of an information signal, RS encoder 915 for encoding of an RS code which is the outer code of a concatenated code, symbol interleaver 920, CRC check bit adder 925, convolutional encoder 930 for encoding of a convolutional code which is the inner code of a concatenated code, bit interleaver 935, and modulator 940.

The decoding apparatus includes demodulator 950, bit deinterleaver 955, convolutional code decoder 960, error detector 965 for detecting by CRC check bits, symbol deinterleaver 970, RS code decoder 975 for decoding by erasure decoding, RS code decoder 980 for decoding by error correction, and binary converter 990 for converting information to binary information.

Next, operation of the present apparatus is described. First, a binary information sequence to be transmitted is inputted to multiple converter 900. Through multiple converter 900, a plurality of information bits are converted into one symbol. To the information sequence after it is converted into multiple symbols, check symbols are added by RS encoder 915, and symbol interleaving is performed by symbol interleaver 920. Thereafter, the information is converted into binary information, and CRC check bits calculated by CRC check bit adder 925 are added to the binary information. Then, convolutional coding is performed for the binary information sequence by convolutional encoder 930, bit interleaving is performed by bit interleaver 935, and the resulting information is outputted to modulator 940. The information sequence is modulated by modulator 940 and sent to a radio transmitter.

In the decoding apparatus, a signal sequence transmitted thereto from a radio receiver is first demodulated by demodulator 950, and deinterleaving is performed for the signal sequence by bit deinterleaver 955, and decoding of inner codes is performed by convolutional code decoder 960. Thereafter, detection of frame errors is performed by error detector 965, and the information is converted into multiple symbol information. Then, the multiple information sequence undergoes deinterleaving by symbol deinterleaver 970. Then, for each frame, if the number of symbols marked as lost is within the range of erasure decoding, erasure decoding is performed by RS code decoder 975 for erasure decoding, but if the number of symbols marked as lost is outside the range of erasure decoding, error correction is performed by RS code decoder 980 for error correction. Finally, the information is, converted back into binary information by binary converter 990 to obtain a received sequence.

Bit interleaver 935 and bit deinterleaver 955 in the present embodiment are added in order to raise the error detection and correction capabilities. Accordingly, a bit interleaver and a bit deinterleaver can be added similarly also to the other embodiments of the present invention.

Figure 9:
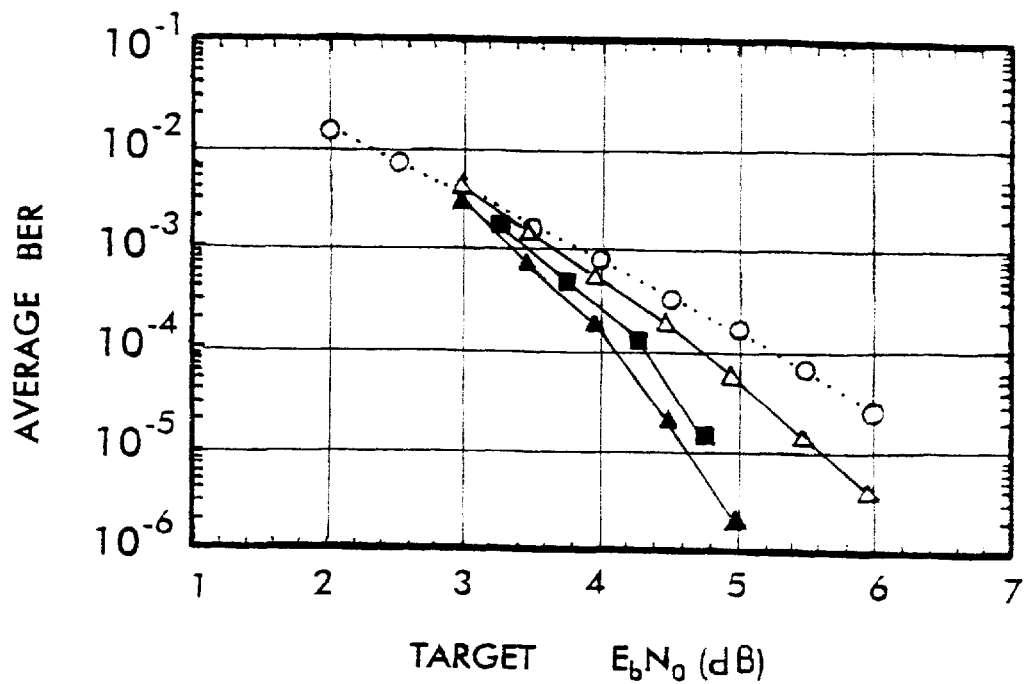
FIG. 9 is a diagram illustrating average bit error ratio characteristics of various decoding systems using a signal to noise power ratio as a parameter.

FIG. 9 illustrates bit error radio characteristics of an inner code, an inner code+an outer code in which error correction is performed, an inner code+an outer code for which the SOVA is used, and an inner code+an outer code which employs CRC check bits in the present embodiment where a signal to noise power ratio is used as a parameter. The axis of ordinate represents the average bit error ratio (average BER), and the axis of abscissa represents the signal energy to thermal noise power spectral density ratio (Eb/No). When compared with decoding which only involves error correction, the systems of the SOVA and the present embodiment which make use of reliability information for each bit in decoding of the inner code exhibit an improvement by approximately 1 dB in Eb/No where the average bit error ratio is $1.0 \times 10^{-5}$.

While the SOVA requires, upon decoding, calculation of a reliability degree for each bit and outputting of a result of the decoding for each bit to the outer code, with the first to third embodiments described above, the invention is required to perform only error correction by CRC check bits after decoding of the inner code is completed and output one bit representing whether or not a frame error has been detected to the decoder for an outer code. Accordingly, when compared with the SOVA, implementation of the apparatus is facilitated, and a characteristic similar to that of the SOVA can be obtained.

While preferred embodiments of the present invention have been described using specific terms, such description is for illustrative purposes only, and it is to be understood that changes and variations may be made without departing from the spirit or scope of the following claims.

What is claimed is:

1. A method of coding an information sequence, comprising the acts of:

partitioning the information sequence into first blocks;

converting the first blocks into symbols of a fixed number of bits, to make frames;

performing outer coding on the frames thereby creating outer coded frames having additional check symbols;

interleaving the symbols of the outer coded frames thereby producing interleaved frames;

converting the interleaved frames into a binary sequence comprised of second blocks;

adding check bits to each of the second blocks of the binary sequence; and performing inner coding on the binary sequence to which the check bits have been added.

2. A method for coding as claimed in claim 1, wherein the information sequence is an information sequence in digital mobile communication and the coding method is used as a channel coding method.

3. A method of decoding an information sequence comprising the acts of:

partitioning the information sequence into blocks;

performing inner decoding on the information sequence to produce a decoded information sequence;

performing error detection for each block of the decoded information sequence, said error detection using detection bits disposed within the decoded information sequence;

converting the decoded information sequence, after the error detection has been performed, into symbols of a fixed number of bits to produce frames;

deinterleaving the frames to produce deinterleaved frames; and performing outer decoding on the deinterleaved frames by erasure decoding.

4. A method of decoding as claimed in claim 3, wherein the information sequence is an information sequence in digital mobile communication and the decoding method is used as a channel coding method.

5. A method for decoding as claimed in claim 3, wherein the act of performing outer decoding includes the act of performing, if the number of symbols included in the frames after the deinterleaving, in which errors have been detected, is not larger than the number of symbols which can be corrected by erasure decoding, decoding of the outer code by erasure decoding, but performing, if the number of symbols included in the frames after the deinterleaving, in which errors have been detected, is larger than the number of symbols which can be corrected by erasure decoding, decoding of the outer code by error correction.

6. A decoding method of decoding as claimed in claim 5, which is used as a channel decoding method.

7. A method of coding and decoding, said method comprising the acts of:

partitioning an information sequence into first blocks;

converting the first blocks into symbols of a fixed number of bits, to make frames;

performing outer coding on the frames thereby creating outer coded frames having additional check symbols;

interleaving the symbols of the outer coded frames thereby producing interleaved frames;

converting the interleaved frames into a binary sequence comprised of second blocks;

adding check bits to each of the second blocks of the binary sequence;

performing inner coding on the binary sequence to which the check bits have been added;

partitioning the binary sequence into third blocks:

performing inner decoding on the binary sequence to produce a decoded binary sequence;

performing error detection for each of the third blocks of the decoded binary sequence, the error detection using the check bits disposed within the decoded binary sequence;

converting the decoded binary sequence, after the error detection has been performed, into symbols of a fixed number of bits to reproduce the interleaved frames;

deinterleaving the interleaved frames to reproduce the outer coded frames; and performing outer decoding on the outer coded frames by erasure decoding.

8. A method of coding and decoding, said method, comprising the acts of:

partitioning an information sequence into first blocks;

converting the first blocks into symbols of a fixed number of bits to make frames;

performing outer coding on the frames thereby creating outer coded frames having additional check symbols;

interleaving the symbols of the outer coded frames thereby producing interleaved frames;

converting the interleaved frames into a binary sequence comprised of second blocks;

adding check bits to each of the second blocks of the binary sequence;

performing inner coding on the binary sequence to which the check bits have been added;

partitioning the binary sequence into third blocks;

performing inner decoding on the binary sequence to produce a decoded binary sequence;

performing error detection for each of the third blocks of the decoded binary sequence, the error detection using the check bits disposed within the decoded binary sequence;

converting the decoded binary sequence, after the error detection has been performed, into symbols of a fixed number of bits to reproduce the interleaved frames;

deinterleaving the interleaved frames to reproduce the outer coded frames; and performing outer decoding on the outer coded frames by erasure decoding; wherein the outer decoding includes the act of performing, if the number of symbols included in the frames after the deinterleaving, in which errors have been detected, is not larger than the number of symbols which can be corrected by erasure decoding, decoding of the outer code by erasure decoding, but performing, if the number of symbols included in the frames after the deinterleaving, in which errors have been detected, is larger than the number of symbols which can be corrected by erasure decoding, decoding of the outer code by error correction.

9. A method of coding and decoding, said method comprising the acts of:

partitioning an information sequence into first blocks;

converting the first blocks into symbols of a fixed number of bits to make frames;

performing outer coding on the frames thereby creating outer coded frames having additional check symbols;

interleaving the symbols of the outer coded frames thereby producing interleaved frames;

converting the interleaved frames into a binary sequence comprised of second blocks;

adding check bits to each of the second blocks of the binary sequence;

performing inner coding on the binary sequence to which the check bits have been added;

the information sequence being an information sequence in digital mobile communication and the method is used as a channel coding method;

partitioning the binary sequence into third blocks:

performing inner decoding on the binary sequence to produce a decoded binary sequence;

performing error detection for each of the third blocks of the decoded binary sequence, the error detection using the check bits disposed within the decoded binary sequence;

converting the decoded binary sequence, after the error detection has been performed, into symbols of a fixed number of bits to reproduce the interleaved frames;

deinterleaving the interleaved frames to reproduce the outer coded frames; and performing outer decoding on the outer coded frames by erasure decoding.

10. A method of coding and decoding, said method comprising the acts of:

partitioning an information sequence into first blocks converting the first blocks into symbols of a fixed number of bits to make frames;

performing outer coding on the frames thereby creating outer coded frames having additional check symbols;

interleaving the symbols of the outer coded frames thereby producing interleaved frames;

converting the interleaved frames into a binary sequence comprised of second blocks;

adding check bits to each of the second blocks of the binary sequence; and performing inner coding on the binary sequence to which the check bits have been added;

the information sequence being an information sequence in digital mobile communication and the method is used as a channel coding method;

partitioning the binary sequence into third blocks;

performing inner decoding on the binary sequence to produce a decoded binary sequence;

performing error detection for each of the third blocks of the decoded binary sequence, the error detection using the check bits disposed within the decoded binary sequence;

converting the decoded binary sequence, after the error detection has been performed, into symbols of a fixed number of bits to reproduce the interleaved frames;

deinterleaving the interleaved frames to reproduce the outer decoded frames; and performing outer decoding on the outer coded frames by erasure decoding;

wherein the act of performing outer decoding includes the act of performing, if the number of symbols included in the frames after the deinterleaving, in which errors have been detected, is not larger than the number of symbols which can be corrected by erasure decoding, decoding of the outer code by erasure decoding, but performing, if the number of symbols included in the frames after the deinterleaving, in which errors have been detected, is larger than the number of symbols which can be corrected by erasure decoding, decoding of the outer code by error correction; and wherein all of the decoding is used as a channel decoding method.

11. A coding apparatus, comprising:

a first converter which partitions an information sequence into first blocks and converts the information sequence into symbols of a fixed number of bits to make frames;

an outer code encoder which performs outer coding on the frames to produce outer coded frames having additional check symbols;

a symbol interleaver which interleaves the symbols of the outer coded frames to produce interleaved frames;

a second converter which converts the interleaved frames into a binary sequence comprised of second blocks:

a check bit adder which adds check bits to each of the second blocks of the binary sequence; and an inner code encoder which performs inner coding on the binary sequence to which the check bits have been added.

12. A coding apparatus as claimed in claim 11, wherein the information sequence is an information sequence in digital mobile communication and the coding apparatus is used as a channel coding apparatus.

13. A decoding apparatus, comprising:

a first converter which partitions an information sequence into blocks;

an inner code decoder which performs inner decoding on the information sequence to produce a decoded information sequence;

a block error detector which performs error detection for each block of the decoded information sequence, said error detector using detection bits disposed within the decoded information sequence;

a second converter which converts the decoded information sequence, after the error detection, into symbols of a fixed number of bits to produce frames;

a deinterleaver which deinterleaves the frames to produce deinterleaved frames; and an outer code decoder which performs outer decoding on the deinterleaved frames by erasure decoding.

14. A coding apparatus as claimed in claim 13, wherein the information sequence is an information sequence in digital mobile communication and the coding apparatus is used as a channel coding apparatus.

15. A decoding apparatus as claimed in claim 13, wherein said outer code decoding means includes means for performing, if the number of symbols included in the frames after the deinterleaving, in which errors have been detected, is not larger than the number of symbols which can be corrected by erasure decoding, decoding of the outer code by erasure decoding, but performing, if the number of symbols included in the frames after the deinterleaving, in which errors have been detected, is larger than the number of symbols which can be corrected by erasure decoding, decoding of the outer code by error correction.

16. A decoding apparatus as claimed in claim 15, which is used as a channel decoding apparatus.

17. A coding and decoding system, comprising:

a first converter which partitions an information sequence into first blocks and then into symbols of a fixed number of bits to make frames;

an outer code encoder which performs outer coding on the frames to produce outer coded frames having additional check symbols;

a symbol interleaver which interleaves the symbols of the outer coded frames to produce interleaved frames;

a second converter which converts the interleaved frames into a binary sequence comprised of second blocks;

a check bit adder which adds check bits to each of the second blocks of the binary sequence;

an inner code encoder which performs inner coding on the binary sequence to which the check bits have been added;

a third converter which partitions the binary sequence into third blocks;

an inner code decoder which performs inner decoding on the binary sequence to produce a decoded binary sequence;

a block error detector which performs error detection for each of the third blocks using the check bits disposed within the decoded binary sequence;

a fourth converter which converts the decoded binary sequence, after the error detection, into symbols of a fixed number of bits to reproduce the interleaved frames;

a deinterleaver which deinterleaves the interleaved frames to reproduce the outer coded frames; and an outer code decoder which performs outer code decoding on the outer coded frames by erasure decoding.

18. A coding and decoding system, comprising:

a first converter which partitions an information sequence into first blocks and then into symbols of a fixed number of bits to make frames;

an outer code encoder which performs outer coding on the frames to produce outer coded frames having additional check symbols;

a symbol interleaver which interleaves the symbols of the outer coded frames to produce interleaved frames;

a second converter which converts the interleaved frames into a binary sequence comprised of second blocks;

a check bit adder which adds check bits to each of the second blocks of the binary sequence;

an inner code encoder which performs inner coding on the binary sequence to which the check bits have been added;

a third converter which partitions the binary sequence into third blocks;

an inner code decoder which performs inner decoding on the binary sequence to produce a decoded binary sequence;

a block error detector which performs error detection for each of the third blocks using the check bits disposed within the decoded binary sequence;

a fourth converter which converts the decoded binary sequence, after the error detection, into symbols of a fixed number of bits to reproduce the interleaved frames;

a deinterleaver which deinterleaves the interleaved frames to reproduce the outer coded frames; and an outer code decoder which performs outer code decoding on the outer coded frames by erasure decoding;

the outer code decoder further performs, if the number of symbols included in the frames after the deinterleaving, in which errors have been detected, is not larger than the number of symbols which can be corrected by erasure decoding, decoding of the outer code by erasure decoding, but performs, if the number of symbols included in the frames after the deinterleaving, in which errors have been detected, is larger than the number of symbols which can be corrected by erasure decoding, decoding of the outer code by error correction.

19. A coding and decoding system, comprising:

a first converter which partitions an information sequence into first blocks and then into symbols of a fixed number of bits to make frames;

an outer code encoder which performs outer coding on the frames to produce outer coded frames having additional check symbols;

a symbol interleaver which interleaves the symbols of the outer coded frames to produce interleaved frames;

a second converter which converts the interleaved frames into a binary sequence comprised of second blocks;

a check bit adder which adds check bits to each of the second blocks of the binary sequence;

an inner code encoder which performs inner coding on the binary sequence to which the check bits have been added;

a third converter which partitions the binary sequence into third blocks;

an inner code decoder which performs inner decoding on the binary sequence to produce a decoded binary sequence;

a block error detector which performs error detection for each of the third blocks using the check bits disposed within the decoded binary sequence;

a fourth converter which converts the decoded binary sequence, after the error detection, into symbols of a fixed number of bits to reproduce the interleaved frames;

a deinterleaver which deinterleaves the interleaved frames to reproduce the outer coded frames; and an outer code decoder which performs outer code decoding on the outer coded frames by erasure decoding.

20. A coding and decoding system, comprising:

a first converter which partitions an information sequence into first blocks and then into symbols of a fixed number of bits to make frames;

an outer code encoder which performs outer coding on the frames to produce outer coded frames having additional check symbols;

a symbol interleaver which interleaves the symbols of the outer coded frames to produce interleaved frames;

a second converter which converts the interleaved frames into a binary sequence comprised of second blocks;

a check bit adder which adds check bits to each of the second blocks of the binary sequence; and an inner code encoder which performs inner coding on the binary sequence to which the check bits have been added;

a third converter which partitions the binary sequence into third blocks;

an inner code decoder which performs inner decoding on the binary sequence to produce a decoded binary sequence;

a block error detector which performs error detection for each of the third blocks using the check bits disposed within the decoded binary sequence;

a fourth converter which converts the decoded binary sequence, after the error detection, into symbols of a fixed number of bits to reproduce the interleaved frames;

a deinterleaver which deinterleaves the interleaved frames to reproduce the outer coded frames; and an outer code decoder which performs outer code decoding on the outer coded frames by erasure decoding.

* * * * *

UNITED STATES PATENT AND TRADEMARK OFFICE
CERTIFICATE OF CORRECTION

PATENT NO.   : 6,081,919
DATED        : June 27, 2000
INVENTOR(S)  : Atsushi Fujiwara et al.

It is certified that error appears in the above-identified patent and that said Letters Patent is hereby corrected as shown below:

On the title page, in the Assignee section, change "NEC Corporation, Japan; NTT Mobile Communication Network, Inc., Japan--.

Signed and Sealed this

Twenty-ninth Day of May, 2001

Attest:

NICHOLAS P. GODICI

*Attesting Officer*        *Acting Director of the United States Patent and Trademark Office*

UNITED STATES PATENT AND TRADEMARK OFFICE
CERTIFICATE OF CORRECTION

PATENT NO.    : 6,081,919
DATED         : June 27, 2000
INVENTOR(S)   : Atsushi Fujiwara et al.

It is certified that error appears in the above-identified patent and that said Letters Patent is hereby corrected as shown below:

Title page,
Item [73], Assignee, change "NEC Corporation, Japan" to -- NEC Corporation, Japan; NTT Mobile Communications Network, Inc., Japan --.

This certificate supersedes Certificate of Correction issued May 29, 2001.

Signed and Sealed this

Nineteenth Day of August, 2003

JAMES E. ROGAN
*Director of the United States Patent and Trademark Office*